US00RE36881E

United States Patent [19]

Muller

[11] E Patent Number: Re. 36,881

[45] Reissued Date of Patent: Sep. 26, 2000

[54] GRADIENT SYSTEM FOR AN NMR TOMOGRAPH

[75] Inventor: Wolfgang Muller, Karlsruhe, Germany

[73] Assignee: Brucker Analytische Messtechnik GmbH, Rheinstetten, Germany

[21] Appl. No.: 08/954,464

[22] Filed: Oct. 20, 1997

Related U.S. Patent Documents

Reissue of:

[64] Patent No.: 5,576,623
Issued: Nov. 19, 1996
Appl. No.: 08/501,716
Filed: Jul. 12, 1995

[30] Foreign Application Priority Data

Jul. 22, 1994 [DE] Germany ..... 44 25 997

[51] Int. Cl.[7] ..... G01V 3/00

[52] U.S. Cl. ..... 324/318; 324/319; 600/422

[58] Field of Search ..... 324/319, 320, 324/321; 128/653.5; 335/296, 299; 600/422, 423, 424

[56] References Cited

U.S. PATENT DOCUMENTS

| | | | |
|---|---|---|---|
| 4,875,485 | 10/1989 | Matsutani | 324/318 |
| 5,146,197 | 9/1992 | Lowe | 335/299 |
| 5,185,576 | 2/1993 | Vavrek et al. | 324/318 |
| 5,293,126 | 3/1994 | Shaefer | 324/318 |
| 5,304,933 | 4/1994 | Vavrek et al. | 324/318 |
| 5,311,134 | 5/1994 | Yamagata et al. | 324/322 |
| 5,323,135 | 6/1994 | Schmidt et al. | 335/299 |
| 5,343,148 | 8/1994 | Westphal et al. | 324/309 |
| 5,414,360 | 5/1995 | Westphal et al. | 324/318 |

FOREIGN PATENT DOCUMENTS

| | | |
|---|---|---|
| 0362931 | 9/1898 | European Pat. Off. . |
| 0140259 | 10/1984 | European Pat. Off. . |
| 9117454 | 4/1991 | European Pat. Off. . |
| 0552542 | 11/1992 | European Pat. Off. . |
| WO9117454 | 4/1991 | WIPO . |

*Primary Examiner*—Louis Arana

[57] ABSTRACT

A gradient system for a nuclear spin resonance (NMR) tomograph with a main magnet system producing a homogeneous magnetic field directed along a z-axis inside a measuring volume, wherein the main magnet system provides access to the measuring volume along the z-axis and transversely to the z-axis, and wherein the gradient system comprises two first partial gradient systems which are located at opposite sides of a central plane perpendicular to the z-axis, across the measuring volume. At least one of the two partial gradient systems is movable between at least two positions along the z-axis. In this way, with a small constructional size and with a simple manufacturing procedure, a gradient system is obtained with high performance capability with respect to generated gradient strength for given ampere turns, high linearity of the generated gradient fields, minimum inductance and minimum electrical resistance of the conductor segments.

18 Claims, 4 Drawing Sheets

GRADIENT SYSTEM FOR AN NMR TOMOGRAPH

Matter enclosed in heavy brackets [ ] appears in the original patent but forms no part of this reissue specification; matter printed in italics indicates the additions made by reissue.

FIELD OF THE INVENTION

The invention concerns a gradient system for a nuclear spin resonance (NMR) tomograph with a main magnet system, producing a homogeneous magnetic field directed along a z-axis inside a measuring volume, in which the main magnet system provides access to the measuring volume transverse to the z-axis, and in which the gradient system comprises two first partial gradient systems which are located at opposite sides of a central plane across the measuring volume which central plane is perpendicular to the z-axis.

Such a gradient system is known from U.S. Pat. No. 5,414,360.

BACKGROUND OF THE INVENTION

NMR tomographs for imaging investigation methods comprise as essential components besides the main magnet a gradient coil system, generally consisting of three gradient coils which can, independently of each other, be supplied with currents of different strengths.

In this way, preferably linear, constant magnetic field gradients with adjustable strengths can be added to the homogeneous magnetic field $B_z$ aligned along the z-axis, inside the measuring volume of the apparatus, wherein the direction of one of these gradients ($dB_z/dz$) in general points along the direction of the homogeneous main field $B_z$ and the directions of the two other gradients ($dB_z/dx$, $dB_z/dy$) are orthogonal to the z-gradient and to each other transverse to the direction of the main field $B_z$.

Whereas in the past tomography systems have essentially been used exclusively for diagnosis, in the future there will be an ever increasing demand for combined systems, inside which therapy measures can immediately be followed and controlled with tomography apparatuses. Numerous therapy measures, e.g. surgical, in particular micro-surgical as well as minimal-invasive operations or radiation treatments require access to the patient to be as unobstructed as possible. However, in conventional NMR systems, this access is blocked, in particular in the transverse direction, inter alia by the gradient coil system.

One approach to solve this problem for partial body tomography systems is described for example, in GB-A-2262808, in which a gradient coil system is described, with a measuring volume which is asymmetric with respect to the z-extension of the tomograph, which is particularly suited for the generation of NMR tomograms of the head region of a patient. Since in this known system the measuring volume is shifted to an axial end of the system by means of a correspondingly asymmetric construction of the gradient coils, the head of the patient examined projects into the tomograph only as far as absolutely necessary. In this way, claustrophobia of the patient can be counteracted. However, the very complicated asymmetric construction of the system and the lack of transverse access possibility are a disadvantage.

The gradient coil system known from WO 91/17454, where the gradient coils as a whole can be shifted inside a C-magnet, too, does not enable transverse access to the measuring volume. In the known assembly, the gradient system must approach the measuring object sidewise, since axial access to the main field magnet is blocked due to the construction.

An NMR tomography system according to U.S. Pat. No. 5,304,933 provides free axial access as well as limited transverse access via small side holes at the circumference of cylindrically shaped coil systems which can be shifted inside each other. A gradient system is provided which can be inserted as a whole in the axial direction into the room temperature bore of a cryomagnet for the generation of a magnetic main field, as well as a radio frequency (RF) coil system which for its part can be inserted axially into the gradient coil system. By means of corresponding small holes at the circumference of the cylindrical coil systems which are located so as to be aligned in the measuring position of both systems in the total assembly, small, narrow instruments can be inserted into this apparatus from a transverse direction into the measuring volume. However, no free transverse access to the measuring volume which could be used by a surgeon is present in this system.

Finally, from U.S. Pat. No. 5,414,360, mentioned above, a gradient coil system for therapy tomographs is known providing transverse as well as an axial access to the measuring volume in such a way that good access from all directions is ensured as required for a treatment of the patient examined. In the known gradient coil system this is achieved by a particular "bent" arrangement of the partial gradient systems which are symmetric with respect to a central plane across the measuring volume perpendicular to the z-axis, wherein each partial coil comprises azimuthal segments having a relatively great axial distance from the central plane and a relatively great radial distance from the z-axis and which are connected to other azimuthal segments by radial conductor segments which are relatively axially close to the central plane and which have a relatively small radial distance from the z-axis. Compared to gradient coil systems which are merely located on a single cylinder surface, such gradient systems have, however, a larger inductance and a lower efficiency, and as a consequence, for identical ampere turns a lower gradient strength inside the measuring volume is reached. Moreover, the shielding effect of the active shielding elements of the gradient coils as provided for the known system to the outside and against interference from the outside is less. Finally, the particular arrangement of the gradient coil segments on different radii requires a relatively complicated winding procedure and a considerably larger radial extension of the completed gradient systems.

BRIEF SUMMARY OF THE INVENTION

The present invention seeks to provide a gradient system for an NMR tomograph, which on the one hand enables a comfortable axial and transverse access to the measuring volume with a constructional size as small as possible and with a simple manufacturing procedure, and which on the other hand has a high performance capability with respect to the gradient strength produced for given ampere turns, a high linearity of the generated gradient fields, and low inductance and electrical resistance of the conductor segments.

In accordance with the invention, there is provided a nuclear magnetic resonance (NMR) tomograph having a main magnet system for generating a homogeneous magnetic field directed along a z-axis inside a measuring volume, wherein the main magnet system provides an access to the measuring volume in a direction transverse to the z-axis, and comprising a gradient system for applying a magnetic field gradient to the said homogenous magnetic field, the gradient system comprising at least two first partial gradient systems which are respectively located on opposite sides of a central plane perpendicular to the z-axis and passing through the measuring volume, each said partial gradient system comprising at least one gradient coil and optionally additionally comprising an active shielding coil wherein at least one said gradient coil or active shielding coil is movable between at least two predetermined positions along the z-axis.

In the tomograph according to the invention, each "gradient system" comprises at least one gradient coil, and may additionally comprise active shielding. In accordance with the invention, at least part of one or more of the gradient systems (i.e., the gradient coil, the active shielding, or both) is movable between at least two predetermined positions along the z-axis.

With a symmetric construction of the partial gradient systems with respect to the central plane E, no current flow across the central plane E is required for gradient generation. Therefore the two partial gradient systems need not comprise any components crossing the central plane E. In this way, it is possible to construct both partial gradient systems so that they are axially movable along the z-axis. In sliding them apart away from the central plane a comfortable transverse access is created, whereby the partial gradient systems can be arranged without difficulty on a single radius around the z-axis, thereby enabling minimum inductance and maximum efficiency, i.e. maximum gradient strength for equal ampere turns as well as maximum shielding efficiency.

In a particularly preferred embodiment both first partial gradient systems are each movable along the z-axis between two predetermined positions. In particular, the total set-up can thereby be moved symmetrically with respect to the central plane E along the z-axis. In this way, the partial gradient systems can be constructed completely mirror symmetrically.

A particularly preferred embodiment comprises two further partial gradient systems which are spatially arranged close to the respective first partial gradient systems, wherein the two further partial gradient systems are inactive in the first predetermined position and can be supplied with current in one of the further predetermined positions along the z-axis by means of external switches. Such a gradient system can be constructed in such a way that in one of the further predetermined positions along the z-axis the gradient properties are particularly adjusted to the respective requirements, whereas in the first predetermined position, for example, a particularly good transverse access to the measuring volume is opened, such that, in this case, only NMR images of reduced quality for control purposes can be taken.

In an embodiment which can be produced particularly easily, the partial gradient systems can be arranged symmetrically with respect to the central plane E. In addition, the symmetric field gradients created in this way, permit a particularly simple processing of the received measuring data.

A further particularly preferred embodiment achieves a current distribution permitting NMR imaging in at least two of the predetermined positions along the z-axis. This can, for example, also be achieved using only the first two partial gradient systems. In both predetermined positions imaging measurements are possible, the measuring object, or the examined patient, respectively, can be monitored permanently, but the quality of the NMR images to be generated can be different for different predetermined positions of the partial gradient systems.

In an advantageous improvement of this embodiment, partial gradient systems are provided for which are geometrically constructed in such a way that in the one predetermined position an optimum transverse access to the measuring volume is opened, and in the other fixed position an optimum shielding is achieved by means of shielding elements. Such a construction is particularly suitable for clinical use and allows for an optimum handling of patient examinations inside the NMR tomograph.

In a further preferred embodiment of the gradient system according to the invention, the partial gradient systems are of the kind known generally in the art as "streamline" coils which are per se known, for example, from U.S. Pat. No. 5,323,135 and EP-A-0140259, which are hereby incorporated by reference. Such streamline coils comprise a particularly high gradient strength, low inductance and a low electric resistance.

An improvement of this embodiment is particularly preferred, where, during operation, both partial gradient systems have a current density distribution varying as cos ($\theta$) whereby $\theta$ is the azimuth angle around the z-axis. In this way, particularly linear field gradient dependencies can be produced, which comprise no tesseral variation of the linearity.

In a particularly preferred embodiment of the gradient system of the invention, active shielding elements are provided inside the NMR tomograph, which, during operation, effect an active shielding of the partial gradient systems in at least one fixed position along the z-axis. In this way, it is possible to safely avoid considerable fringes of the gradient fields entering the structure of the main field magnet system and possibly inducing eddy currents which in their turn would disturb the homogeneity of the main magnetic field generated inside the measuring volume.

An improvement of this embodiment provides for active shielding elements that are connected to the partial gradient systems in such a way that, during a movement of the partial gradient systems along the z-axis, a coupled movement of the active shielding elements coupled thereto is effected along the z-axis. In this way, at each arbitrary position, the partial gradient systems and the elements of the active shielding together form a common unit, so that all the time an exact positioning of the individual system components is guaranteed. Thereby it can be ensured that the shielding effect is optimum all the time and during each phase of operation of the tomograph.

In an alternative improvement of the above embodiment of the gradient system according to the invention, the active shielding elements are rigidly connected to the main magnet system. Such a construction can be manufactured relatively easily and there are no movable parts required to shift the shielding elements.

According to the invention, such a gradient system can be improved in that the active shielding elements comprise a shielding coil system which is bent around the structure of the main magnet system parallel to the central plane at one or both sides. Thereby a considerably better shielding of the main magnet system against the generated gradient fields is achieved, thereby facilitating a reduced eddy current generation inside the main magnet and, as a consequence, a reduced disturbance of the field homogeneity inside the measuring volume during gradient switching.

In an alternative embodiment only a part of the active shielding elements are movable and the remaining part is in a fixed position rigidly coupled to the main magnet system. In particular, the gradient coils of the partial gradient systems may be immovable, whereas only parts of the active shielding system are movable along the z-axis.

An embodiment of the gradient system according to the invention is particularly preferred, where inside the NMR tomograph a radio frequency (RF) coil system is provided for, allowing for an access to the measuring volume along the z-axis and transverse to the z-axis. Thereby the free transverse access to the measuring volume facilitated by the gradient system of the invention is not restricted by the geometry of the RF systems.

In an advantageous improvement of this embodiment, the RF coil system comprises two partial coil systems arranged on both sides of the central plane, and which are movable along the z-axis in the same as the partial gradient systems. The same advantages as described above for the gradient system of the invention can thereby be achieved. The partial coil systems can advantageously be coupled mechanically to the partial gradient systems and shifted together with these. In this way, the handling of the gradient system of the invention becomes easier since shifting of the partial coil systems and of the partial gradient systems requires only one single movement process.

Finally, in an embodiment of the gradient system of the invention which is particularly preferred, the partial gradient systems comprise one-sided recesses perpendicular to the z-axis in the range of central plane E, which recesses extend only across a part of the azimuthal angle range around the z-axis. By means of the coil parts of the gradient system which are in the immediate neighborhood of the measuring volume, a considerably higher gradient strength for equal current through the coils is reached. In this way, the efficiency of the gradient system of the invention can be increased even further. In further simplified embodiments, it is thereby even possible, to realize the gradient system of the invention without any axial mobility of the partial gradient systems along the z-axis, whereby the above presented aim of the invention is nevertheless completely and adequately achieved. This is possible since for whole body examinations of patients in an NMR tomograph, the bottom of the construction need not comprise a possibility of free transverse access, since the patient rests anyway on a continuous patient bed. It is therefore perfectly sufficient to provide for a one-sided recess of the gradient coils on both sides of the central plane E in the upper azimuthal angular range. If this recess is formed with a sufficient axial length parallel to the z-axis, the entire gradient system can also easily be designed rigid and joined together at the bottom across the central plane E. In this way, the costly mechanisms for shifting the partial gradient systems can be saved, whereby an operator keeps nevertheless an optimum free access to the measuring volume from above and from the side.

A preferred embodiment of the invention will now be described in detail with reference the accompanying drawings. The preferred features and mentioned above those to be further described below in accordance with the invention can be utilized individually or collectively in arbitrary combination. The embodiments shown and described are not to be considered as exhaustive enumeration, but rather have exemplary character only.

DESCRIPTION OF THE PREFERRED EMBODIMENTS

Figure 1:
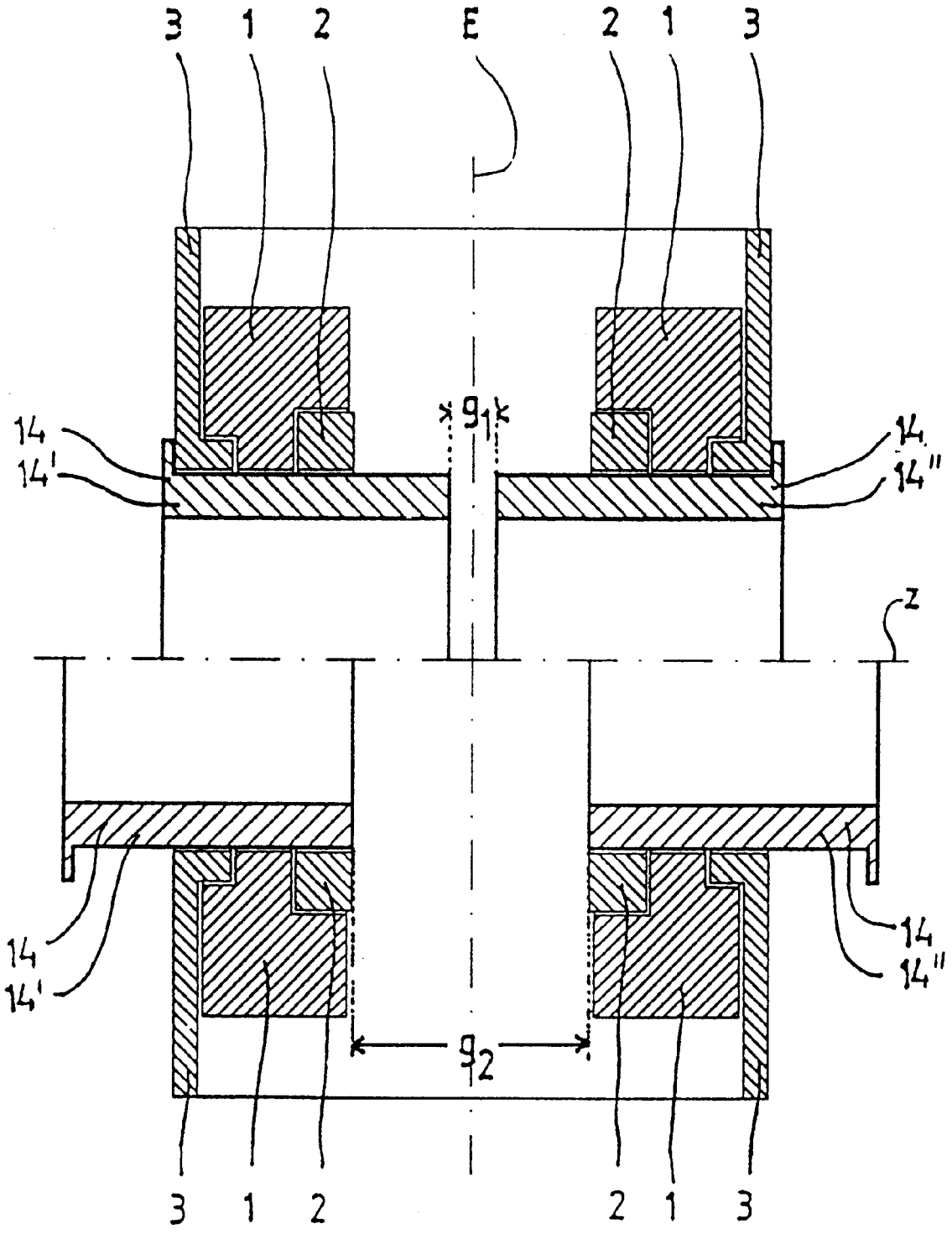
FIG. 1 is a schematic horizontal cross section containing the z-axis through an NMR tomograph with a gradient system in accordance with the invention, in which in the upper half of the figure the partial gradient systems are shown in the position of maximum approach, and in the lower half of the figure the partial gradient systems are shown in the position of maximum separation.

FIG. 1 shows a schematic horizontal cross section through an NMR tomograph with a main magnet system consisting of a magnet coil 1, a ferromagnetic ring 2 to homogenize the magnetic field generated inside the measuring volume as well as an iron shield 3. Radially inside the main magnet system, a gradient system 14 for the generation of a field gradient being as linear as possible in three spatial directions inside the measuring volume is located and can be shifted along the common z-axis. In the embodiment shown, gradient system 14 consists of two partial gradient systems 14', 14", which are located at opposite sides of a central plane E across the measuring volume which plane is perpendicular to the z-axis. In an advantageous way, the gradient system 14, as well as the main magnet system 1, 2, 3, also, are mirror symmetrical with respect to central plane E. For particular cases of use, it may, however, be preferred to choose asymmetric configurations.

In the upper part of FIG. 1, the gradient system according to the invention, which is movable along the z-axis, is shown in a first position, in which transverse access to the measuring volume in the central plane E is possible only in a limited way through a small slit $g_1$. By shifting each of the two partial gradient systems 14', 14" away from the central plane E outwards, the gradient system 14 can be brought into a second position, as shown in the lower part of FIG. 1. In this second position, the partial gradient systems are separated by a distance $g_2$, whereby a correspondingly large transverse access to the measuring volume in the center of the NMR tomograph is opened. In this position, with an appropriately designed partial gradient system, an imaging NMR measurement may also still be possible, although the resolution is considerably reduced as compared to the first position. For control purposes such exposures may nevertheless be still sufficient.

The gradient system in FIG. 1 can, as well as the gradient coils used to create the magnetic gradient fields in the measuring volume, comprise active shielding elements which, are also movable along the z-axis and which, in operation during gradient switchings, shield the main magnet system from the generated field gradients in order to avoid the induction of eddy currents in the conducting structures of the main magnet system.

Figure 2:
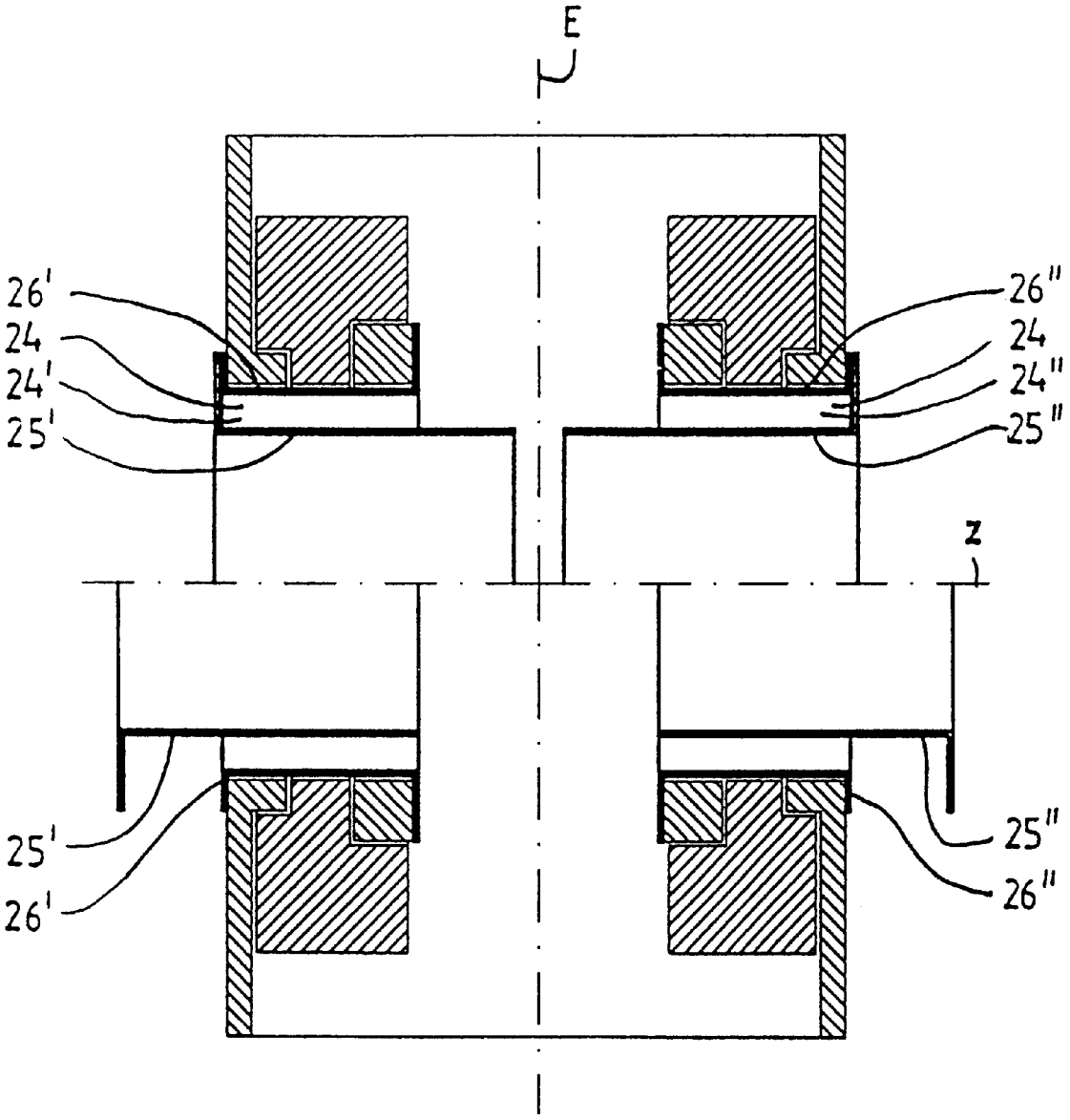
FIG. 2 shows an NMR tomograph with a gradient system in accordance with the invention, represented in the same manner as in FIG. 1, however, with active shielding elements which are rigidly connected to the main magnet system.

In FIG. 2 such a further embodiment is shown, where the gradient system 24 comprises as part of the partial gradient systems 24', 24" gradient coils 25', 25" and active shielding elements 26', 26". In the lower half of the figure, the total system is again represented in the separated state of both partial gradient systems 24', 24". In this embodiment the active shielding elements 26', 26" are rigidly connected to the main magnet system 1, 2, 3 and do not follow the movement of the partial gradient systems 25', 25" along the z-axis. Shielding elements 26', 26" consist of a shielding coil system which is bent around the main magnet 1, 2, 3 structure on both sides parallel to the central plane in order to achieve particularly good shielding.

Figure 3:
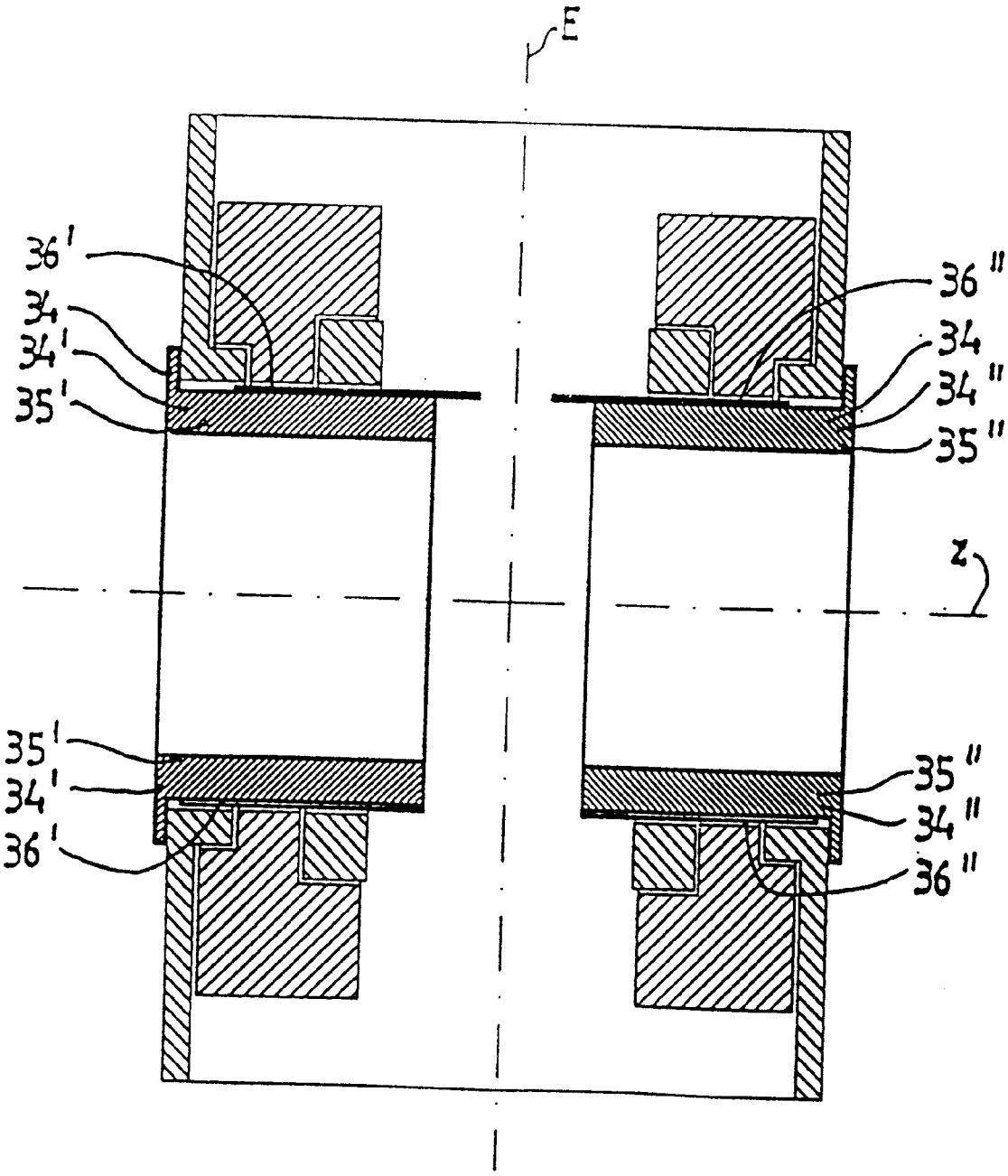
FIG. 3 shows an NMR tomograph with a gradient system in accordance with the invention represented in the same manner as in FIG. 2, but with active shielding elements which are movable with respect to the gradient system and the main magnet system, in the measuring position (upper half of the figure) and in the access position (lower half of the figure)

A further embodiment of the invention is shown in FIG. 3. In FIG. 3 the gradient system 34 comprising partial gradient systems 34', 34" consists of gradient coils 35', 35" as well as of active shielding elements 36', 36". In the upper half of the figure, the shielding elements 36', 36" are shifted together along the z-axis in the direction towards the central plane E, whereas in the lower half of the figure, they leave open a maximum transverse access to the measuring volume in the center of the construction.

In the embodiment shown in FIG. 3, the partial gradient systems may additionally comprise, apart from the gradient coils 35', 35", also further shielding elements which are not explicitly drawn and which are rigidly connected to the gradient coils 35', 35". In particular, it can be advantageous to have only shielding elements 36', 36" movable, whereas the rest of the partial gradient systems 35', 35" is rigidly connected to the main magnet system 1, 2, 3. In the upper half of FIG. 3, the movable shielding elements 36', 36" are shifted to cover the transverse access range like a hood, so that only a small gap remains. In this position, the shielding efficiency is optimum, so that NMR images with particularly good resolution can be taken. In the position indicated in the lower half of the figure, the "hood" has been moved outwards, so that a wide transverse access to the measuring volume has been opened.

In all embodiments of the invention, it is desirable to provide location means for the exact positioning along the z-axis of the various movable components in predetermined positions. Such locating means may take the form of one or more marks, stops, or guides but preferably includes means for fixing the various movable components firmly but releasably in the various predetermined positions, such as bolts or other similar locking means. In addition, the device should comprise the means for current distribution necessary for generation of the gradient fields inside the given volume. For example, the coils of the gradient system can be wound from single wires. However, they can also be produced from plate material by means of suitable cutting methods. With the last-mentioned method, the streamline-shaped coils may be realized particularly well.

Figure 4A:
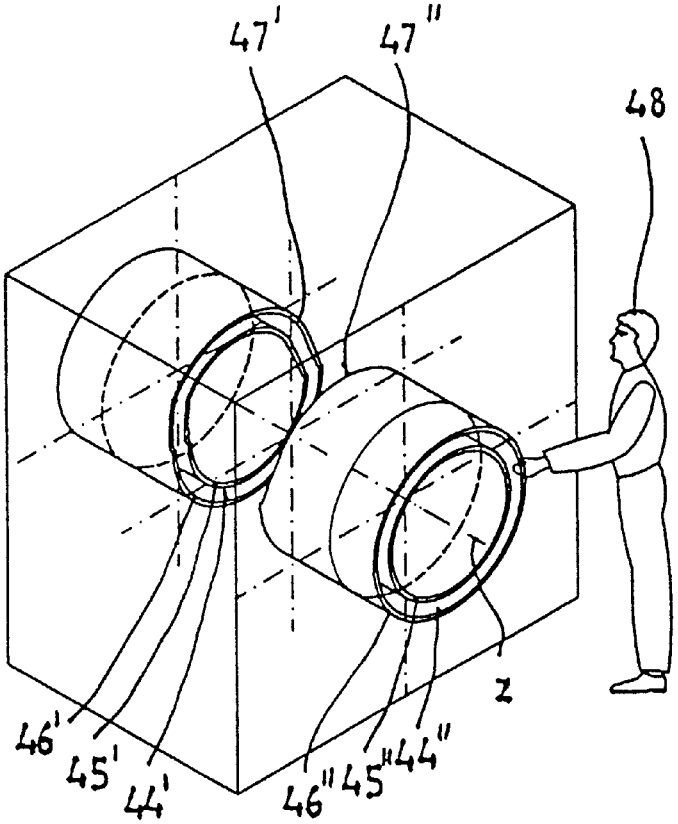
FIG. 4a is a schematic three-dimensional representation of a gradient system in accordance with the invention with azimuthal recesses in the range of the central plane, with the elements in the separated condition state.

In FIG. 4a, a further embodiment of the gradient system according to the invention is shown, where the partial gradient systems 44', 44" (consisting of gradient coils 45', 45" and active shielding elements 46', 46") comprise one-sided recess 47', 47" in the range of the central plane perpendicular to the z-axis, which extend across only a part of the azimuthal angular range of the corresponding elements around the z-axis. In the axially separated state of the partial gradient systems 45', 45" shown in FIG. 4a, these recesses 47', 47" are barely noticeable. In the shifted together state, as shown in FIG. 4b, however, the recesses 47', 47" form a transverse access gap in the upper and side range of the gradient systems, whereas the lower range is completely continuous in this shifted together position.

Recesses 47', 47" can be shaped elliptically or rectangularly. The larger the extension of the opening defined by recesses 47', 47" in the closed position of the gradient system, the stronger is the deviation of the spatial gradient current distribution from that required with a closed cylinder structure. Therefore, in particular cases it may be advantageous to select only a narrow gap, through which at least life-monitoring leads can be guided into the measuring volume or through which minimal surgical operations are possible. With the optimum free access, however, as opened in FIG. 4a for separated partial gradient systems 45', 45", the expected resolution of the NMR tomograms is probably considerably less than in the closed state.

Figure 4B:
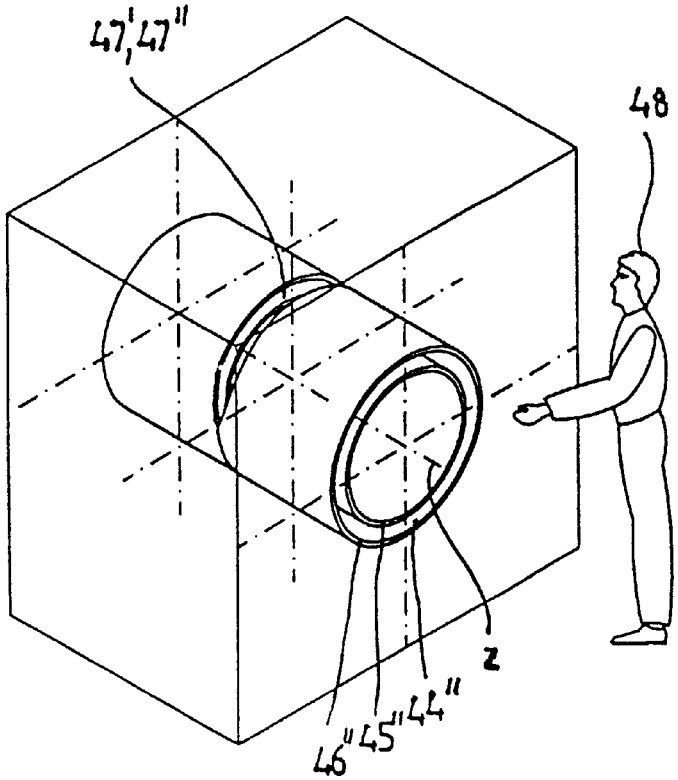
FIG. 4b shows the system of FIG. 4a with the elements in the non-separated condition.

In order to compare proportions, FIGS. 4a and 4b each show an upright operator 48 in front of the tomograph.

I claim:

1. A nuclear magnetic resonance (NMR) tomograph having a main magnet system *in a fixed position* for generating a homogeneous magnetic field directed along a z-axis inside a measuring volume, wherein the main magnet system provides an access to the measuring volume in a direction transverse to the z-axis, and comprising a gradient system for applying a magnetic field gradient to the said homogenous magnetic field, the gradient system comprising at least two first partial gradient systems which are respectively located on opposite sides of a central plane perpendicular to the z-axis and passing through the measuring volume, each said partial gradient system comprising at least one gradient coil, wherein the gradient coil of at least one of the first partial gradient systems is movable between at least two predetermined positions along the z-axis.

2. A tomograph according to claim 1 wherein the gradient coil of each of the first partial gradient systems is movable between two predetermined positions along the z-axis.

3. A tomograph as claimed in claim 1, wherein the two first gradient systems each further comprises an active shielding coil which is movable between at least two predetermined positions along the z-axis.

4. A tomograph as claimed in claim 1, which comprises active shielding elements which during operation effect an active shielding of the partial gradient systems in at least one said predetermined position along the z-axis.

5. A tomograph as claimed in claim 4, wherein the active shielding elements are movable along the z-axis.

6. A tomograph as claimed in claim 5, wherein the active shielding elements are connected to the partial gradient systems in such a way that movement of the active shielding elements takes place together with movement of the said gradient coils along the z-axis.

7. A tomograph as claimed in claim 4, wherein the active shielding elements are fixed to the main magnet system.

8. A tomograph as claimed in claim 7, wherein the active shielding elements comprise a shielding coil system which is bent around the structure of the main magnet system parallel to the central plane on one or both sides.

9. A tomograph as claimed in claim 1 which further comprises two further partial gradient systems located in the vicinity of the respective said first partial gradient systems, wherein the two further partial gradient systems are inactive in at least one said predetermined position of the said at least one part and able to be supplied with current in at least one of the said predetermined position of the said at least one part.

10. A tomograph as claimed in claim 1, wherein the partial gradient systems are arranged symmetrically with respect to the central plane.

11. A tomograph as claimed in claim 1, wherein the arrangement is such that NMR imaging is possible in at least two of the said predetermined positions along the z-axis.

12. A tomograph as claimed in claim 1 wherein the partial gradient systems are geometrically shaped in such a way that in one of the said predetermined positions an optimum transverse access to the measuring volume is opened, and in the other predetermined position an optimum shielding by shielding elements is achieved.

13. A tomograph as claimed in claim 1, wherein the partial gradient systems are constructed as streamline coils.

14. A tomograph as claimed in claim 13, wherein the partial gradient systems are such that, during operation a current distribution is produced which varies with $\cos(\theta)$, wherein $\theta$ is the azimuth angle around the z-axis.

15. A tomograph as claimed in claim 1, which also comprises a radio frequency (RF) coil system positioned so as to allow access to the measuring volume along the z-axis and transverse to the z-axis.

16. A tomograph as claimed in claim 15, wherein the RF coil system comprises two partial coil systems arranged respectively on opposite sides of the said central plane, which are movable along the z-axis.

17. A tomograph as claimed in claim 16, wherein the partial coil systems of the RF coil system are mechanically coupled to the partial gradient systems and movable together with these.

18. A tomograph as claimed in claim 1, wherein the partial gradient systems comprise one-sided recesses in the range of the central plane perpendicular to the z-axis, which extend only over a part of the azimuthal angular range around the z-axis.

* * * * *